United States Patent
Hirose

(10) Patent No.: US 12,255,039 B2
(45) Date of Patent: Mar. 18, 2025

(54) ION IMPLANTER, ION IMPLANTATION METHOD, AND SEMICONDUCTOR DEVICE MANUFACTURING METHOD

(71) Applicant: SUMITOMO HEAVY INDUSTRIES, LTD., Tokyo (JP)

(72) Inventor: Sayumi Hirose, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 590 days.

(21) Appl. No.: 17/512,302

(22) Filed: Oct. 27, 2021

(65) Prior Publication Data

US 2022/0130636 A1 Apr. 28, 2022

(30) Foreign Application Priority Data

Oct. 28, 2020 (JP) ................. 2020-180902

(51) Int. Cl.
| | | |
|---|---|---|
| H01J 37/08 | (2006.01) | |
| H01J 27/20 | (2006.01) | |
| H01J 37/32 | (2006.01) | |
| H01L 21/265 | (2006.01) | |

(52) U.S. Cl.
CPC .............. *H01J 37/08* (2013.01); *H01J 27/20* (2013.01); *H01J 37/32412* (2013.01); *H01L 21/265* (2013.01); *H01J 2237/31701* (2013.01)

(58) Field of Classification Search
CPC .. H01J 37/08; H01J 37/3171; H01J 37/32412; H01J 2237/31701; H01J 2237/061
See application file for complete search history.

(56) References Cited

U.S. PATENT DOCUMENTS

| | | | |
|---|---|---|---|
| 6,593,580 B2 | 7/2003 | Miyabayashi | |
| 6,878,945 B1 * | 4/2005 | Taniguchi | H01J 27/02 315/111.81 |
| 11,978,608 B2 * | 5/2024 | Ishida | H01J 37/18 |
| 2002/0153493 A1 * | 10/2002 | Miyabayashi | H01J 37/08 392/389 |
| 2007/0191658 A1 * | 8/2007 | Lai | B01J 29/7038 423/709 |
| 2010/0241220 A1 * | 9/2010 | McClain | A61L 31/10 623/1.42 |

FOREIGN PATENT DOCUMENTS

| | | | |
|---|---|---|---|
| JP | 2002-324493 A | | 11/2002 |
| KR | 20190031315 A | * | 3/2019 |

* cited by examiner

*Primary Examiner* — David E Smith
*Assistant Examiner* — Hsien C Tsai
(74) *Attorney, Agent, or Firm* — Michael Best & Friedrich LLP

(57) ABSTRACT

An ion implanter includes a crucible provided inside a vacuum chamber, and including an internal space configured to accommodate a solid sample which is a raw material of a source gas, a laser source provided outside the vacuum chamber, and irradiating the crucible with a laser beam, an arc chamber including an internal space for converting the source gas into plasma to generate ions, and in which an ion beam is extracted from the internal space, and a nozzle connecting the internal space of the crucible and the internal space of the arc chamber, and introducing the source gas vaporized in the internal space of the crucible into the internal space of the arc chamber.

14 Claims, 2 Drawing Sheets

ION IMPLANTER, ION IMPLANTATION METHOD, AND SEMICONDUCTOR DEVICE MANUFACTURING METHOD

RELATED APPLICATIONS

The content of Japanese Patent Application No. 2020-180902, on the basis of which priority benefits are claimed in an accompanying application data sheet, is in its entirety incorporated herein by reference.

BACKGROUND

Technical Field

Certain embodiments of the present disclosure relate to an ion implanter, an ion implantation method, and a semiconductor device manufacturing method.

Description of Related Art

In a semiconductor manufacturing process, a process of implanting ions into a semiconductor wafer (also referred to as an ion implantation process) is generally performed in order to change conductivity of a semiconductor, and/or in order to change a crystal structure of the semiconductor. A device used in this process is generally called an ion implanter. In this ion implanter, an ion generator for converting a source gas into plasma to generate ions is used. For example, the source gas is generated by heating a solid sample containing an impurity element with an electric heater and vaporizing the solid sample (for example, refer to the related art).

SUMMARY

According to an aspect of the present disclosure, there is provided an ion implanter including a crucible provided inside a vacuum chamber, and including an internal space configured to accommodate a solid sample which is a raw material of a source gas, a laser source provided outside the vacuum chamber, and irradiating the crucible with a laser beam, an arc chamber including an internal space for converting the source gas into plasma to generate ions, and in which an ion beam is extracted from the internal space, and a nozzle connecting the internal space of the crucible and the internal space of the arc chamber, and introducing the source gas vaporized in the internal space of the crucible into the internal space of the arc chamber.

According to another aspect of the present disclosure, there is provided an ion implantation method. The method includes introducing a solid sample containing at least one of aluminum, indium, antimonide, tin, and magnesium into an internal space of a crucible, introducing the crucible into which the solid sample is introduced into a vacuum environment, heating the crucible to a temperature of 100° C. or higher and 3,000° C. or lower by irradiating an outside of the crucible with a laser beam having an output selected from a range of 0.1 kW or higher and 10 kW or lower, and having a wavelength range selected from a range of 200 nm or larger and 2,000 nm or smaller, generating a source gas by vaporizing the solid sample in the internal space of the crucible, introducing the source gas into an internal space of an arc chamber; generating ions by converting the source gas into plasma in the internal space of the arc chamber, extracting an ion beam from the internal space of the arc chamber, and irradiating a semiconductor wafer with the ion beam.

According to still another aspect of the present disclosure, there is provided a semiconductor device manufacturing method. The method includes introducing a solid sample containing at least one of aluminum, indium, antimonide, tin, and magnesium into an internal space of a crucible, introducing the crucible into which the solid sample is introduced into a vacuum environment, heating the crucible to a temperature of 100° C. or higher and 3,000° C. or lower by irradiating an outside of the crucible with a laser beam having an output selected from a range of 0.1 kW or higher and 10 kW or lower, and having a wavelength range selected from a range of 200 nm or larger and 2,000 nm or smaller, generating a source gas by vaporizing the solid sample in the internal space of the crucible, introducing the source gas into an internal space of an arc chamber; generating ions by converting the source gas into plasma in the internal space of the arc chamber, extracting an ion beam from the internal space of the arc chamber, and irradiating a semiconductor wafer with the ion beam.

DETAILED DESCRIPTION

Figure 1:
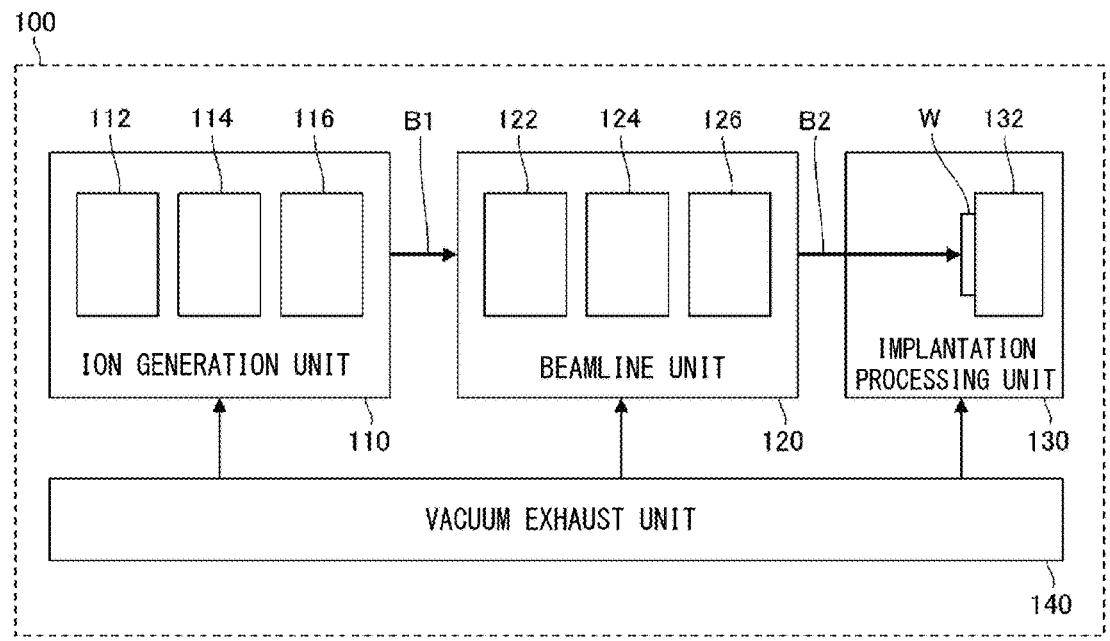
FIG. 1 is a functional block diagram illustrating an example of a schematic configuration of an ion implanter according to an embodiment.

When a solid sample is heated with an electric heater, it may take a long time until a source gas is stably generated.

It is desirable to provide a technique in which a source gas generated by vaporizing a solid sample is stably supplied in a short time.

Any desired combination of the above-described components, and those in which the components or expressions according to the present disclosure are replaced in methods, devices, or systems are effectively applicable as an aspect of the present disclosure.

Hereinafter, embodiments for an ion implanter, an ion implantation method, and a semiconductor device manufacturing method according to the present disclosure will be described in detail with reference to the drawings. In describing the drawings, the same reference numerals will be assigned to the same elements, and repeated description will be appropriately omitted. Configurations described below are merely examples, and do not limit the scope of the present invention in any way.

FIG. 1 is a functional block diagram illustrating an example of a schematic configuration of an ion implanter 100 according to the embodiment. The ion implanter 100 includes an ion generation unit 110, a beamline unit 120, an implantation processing unit 130, and a vacuum exhaust unit 140.

The ion generation unit 110 generates an ion beam to be implanted into a semiconductor wafer W. The ion generation unit 110 includes an ion source 112, an extraction electrode 114, and a mass analyzing unit 116. The ion source 112 generates plasma discharge in an internal space of an arc chamber. In this manner, the ion source 112 generates ions by ionizing atoms or molecules of a source gas introduced into the internal space of the arc chamber. The extraction electrode 114 generates the ion beam in such a manner that the ions generated in the internal space of the arc chamber are extracted in a beam shape as an ion group to an outside of the arc chamber. For example, in the extraction electrode 114, a negative extraction voltage is applied to the arc chamber, and the ion beam is accelerated by the extraction voltage. The mass analyzing unit 116 applies a magnetic field to the ion beam extracted by the extraction electrode 114 to deflect the ion beam so that only a target ion species is selected. The ion beam B1 configured to include an ion group of the target ion species is provided for the beamline unit 120 subsequent thereto. The ion beam B1 provided for the beamline unit 120 from the ion generation unit 110 is also referred to as a "first ion beam".

The beamline unit 120 transports the first ion beam B1 provided from the ion generation unit 110 toward the implantation processing unit 130. The beamline unit 120 generates the second ion beam B2 by performing at least any one of deflecting, accelerating, decelerating, or shaping the first ion beam B1, or scanning with the first ion beam B1. For example, the beamline unit 120 includes a beam shaping unit 122 configured to include a quadrupole lens device for shaping the first ion beam B1, a beam scanning unit 124 for reciprocal scanning with the first ion beam B1 in a first direction, and a beam parallelizing unit 126 that parallelizes the first ion beam B1 used in the reciprocal scanning in the first direction. For example, the beamline unit 120 provides a scan beam used in the reciprocal scanning in the first direction for the implantation processing unit 130 subsequent thereto. The ion beam B2 provided for the implantation processing unit 130 from the beamline unit 120 is also referred to as a "second ion beam".

The implantation processing unit 130 accommodates the semiconductor wafer W to be irradiated with the second ion beam B2, and holds the semiconductor wafer W to be irradiated with the second ion beam B2. The implantation processing unit 130 has a mechanical scan mechanism 132 that holds the semiconductor wafer Wand causes the semiconductor wafer W to reciprocate in a second direction. For example, the semiconductor wafer W to be mechanically scanned in the second direction (vertical direction of the semiconductor wafer) in the implantation processing unit 130 is irradiated with the second ion beam B2 used in the reciprocal scanning in the first direction (width direction or horizontal direction of the semiconductor wafer) in the beamline unit 120. An entire surface of the semiconductor wafer W is irradiated with the ion beam B2 by performing a hybrid scan which is a combination of a beam scan and a mechanical scan.

The vacuum exhaust unit 140 includes a vacuum exhaust system for providing a desired vacuum environment for the ion generation unit 110, the beamline unit 120, and the implantation processing unit 130. In anion implantation process during which the semiconductor wafer is irradiated with the ion beam, the vacuum exhaust unit 140 provides a vacuum environment for each of the ion generation units 110, the beamline unit 120, and the implantation processing unit 130. The vacuum environment provided for each of the ion generation unit 110, the beamline unit 120, and the implantation processing unit 130 may be different in each unit or may be the same in each unit.

It is conceivable to adopt various aspects for a configuration of each unit of the ion implanter according to the present disclosure. The ion implanter according to the present disclosure includes a vaporizer to be described later with reference to FIG. 2, and uses a solid sample as a raw material of the source gas. The ion implanter according to the present disclosure may have another configuration as long as the configuration includes the vaporizer for heating the solid sample to generate the source gas. It should be noted that an aspect of the configuration of each unit of the ion implanter is not limited to the configuration illustrated in FIG. 1.

According to an aspect of the present disclosure, the ion generation unit 110 includes the vaporizer for supplying the source gas to the arc chamber of the ion source 112. The vaporizer is configured to heat and vaporize the solid sample which is the raw material of the source gas, and to supply the vaporized source gas to the arc chamber. The vaporizer according to the present disclosure utilizes laser beam to heat the solid sample. The vaporizer configured in this way will be described in detail with reference to FIG. 2.

Figure 2:
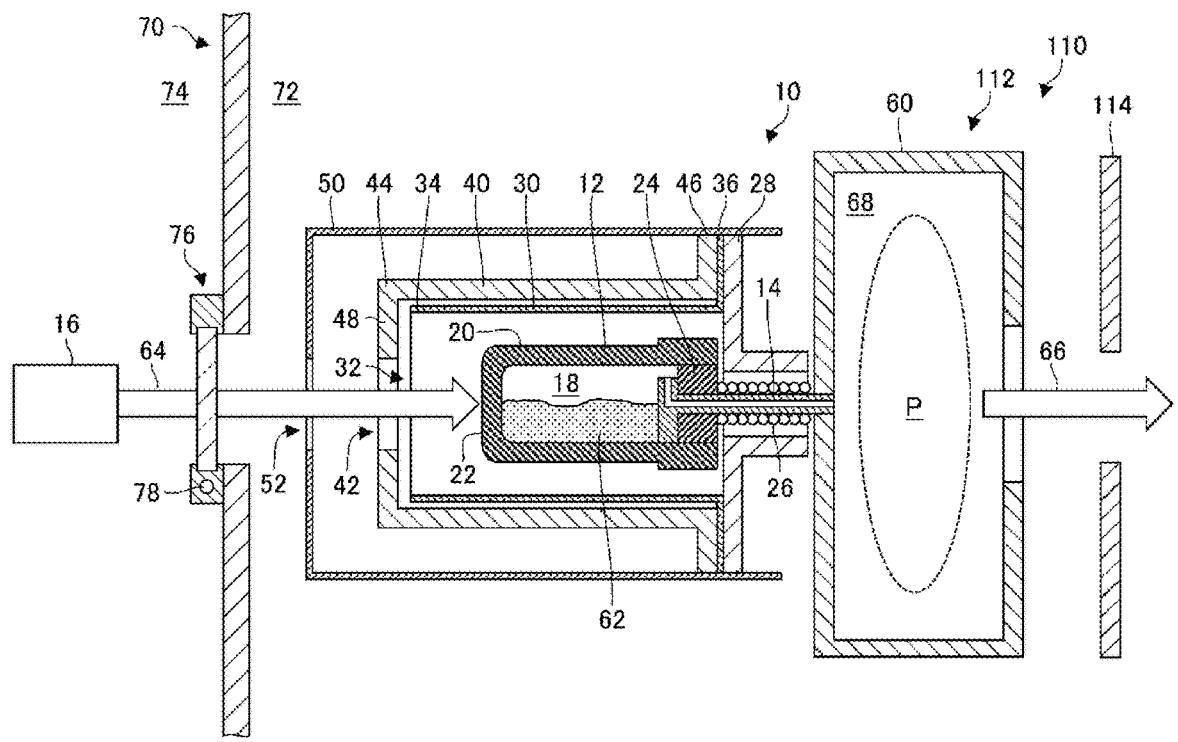
FIG. 2 is a view illustrating an example of a schematic configuration of a vaporizer according to an embodiment.

FIG. 2 is a view illustrating a schematic configuration of a vaporizer 10 according to the embodiment. The vaporizer 10 is a device for supplying the source gas to an arc chamber 60 provided on an inside 72 of the vacuum chamber 70. The arc chamber 60 is configured to convert the source gas supplied from a nozzle 14 of the vaporizer 10 into plasma to generate ions and output an ion beam 66.

The arc chamber 60 has an internal space 68 for generating plasma P from the source gas. For example, the arc chamber 60 is included in an ion source 112 of the ion implanter 100 in FIG. 1. The ion beam 66 is extracted from the internal space 68 of the arc chamber 60 by an extraction electrode 114, for example.

The vaporizer 10 includes a crucible 12, the nozzle 14, and a laser source 16. In the drawing, a direction in which the nozzle 14 extends from the vaporizer 10 toward the arc chamber 60 may be referred to as an axial direction. A direction perpendicular to the axial direction may be referred to as a radial direction, and a direction surrounding the axial direction may be referred to as a circumferential direction.

The crucible 12 is provided on the inside 72 of the vacuum chamber 70. The crucible 12 is a chamber including a vaporization chamber 18 which is an internal space for heating and vaporizing the solid sample 62. The crucible 12 has a side wall 20 formed in a cylindrical shape and a bottom portion 22 for closing an end portion of the side wall 20. A lid 24 is detachably attached to an opening end of the crucible 12, and the vaporization chamber 18 is closed by the lid 24. The crucible 12 and the lid 24 are made of graphite.

The solid sample 62 contains an impurity element extracted as the ion beam 66. The solid sample 62 is solid under a normal temperature and a normal pressure, and has a powdery or granular shape. The solid sample 62 is vaporized by being heated in the vaporization chamber 18, and is converted into a gas containing the impurity element, that is, the source gas. A type of the impurity element contained in the solid sample 62 is not particularly limited, and for example, the type may include aluminum (Al), indium (In), antimonide (Sb), gallium (Ga), tin (Sn), or magnesium (Mg).

The nozzle 14 is a pipe for supplying the source gas generated in the vaporization chamber 18 to the arc chamber 60. The nozzle 14 is attached to the lid 24, and connects the vaporization chamber 18 and the internal space 68 of the arc chamber 60. The nozzle 14 is located on a side opposite to the bottom portion 22 of the crucible 12 while the vaporization chamber 18 is interposed therebetween. An electric heater 26 can be provided on an outer periphery of the nozzle 14. The electric heater 26 heats the nozzle 14 through which the gas passes, thereby preventing the source gas from being cooled and stuck inside the nozzle 14.

The laser source 16 is provided on an outside 74 of the vacuum chamber 70. The crucible 12 provided on the inside 72 of the vacuum chamber 70 is irradiated with a laser beam 64 generated by the laser source 16 through a vacuum window 76 provided in the vacuum chamber 70. The vacuum window 76 is provided with a cooling flow path 78 through which a fluid (cooling water) for cooling the vacuum window 76 passes.

The laser source 16 is configured to generate the laser beam 64 of ultraviolet, visible, or near-infrared light included in a wavelength range of 200 nm or larger and 2,000 nm or smaller, for example. A form of the laser source 16 is not limited, and for example, a small and easy-to-handle semiconductor laser can be used. The laser beam 64 may be continuous light, or may be pulsed light. For example, an output of the laser source 16 is 0.1 kW or higher and 10 kW or lower, is preferably 0.2 kW or higher and 5 kW or lower, and is more preferably 0.3 kW or higher and 2 kW or lower. The laser source 16 is not particularly limited, as long as the laser source 16 outputs the laser beam 64 having an output and a wavelength which enable the crucible 12 to be heated to a temperature lower than a melting point of at least a material forming the crucible 12. A temperature at which the crucible is heated by the laser beam 64 is 100° C. or higher and 3,000° C. or lower, is preferably 500° C. or higher and 2,000° C. or lower, and is more preferably 700° C. or higher and 1,500° C. or lower. As an example of the laser source 16, a semiconductor laser that outputs the continuous light of 450 W at a wavelength of 967 nm can be used.

The outside of the crucible 12 is irradiated with the laser beam 64 from the laser source 16, and for example, the bottom portion 22 of the crucible 12 is irradiated with the laser beam 64. The crucible 12 is heated when the bottom portion 22 is irradiated with the laser beam 64. Therefore, a portion closer to the bottom portion 22 is likely to be heated by the laser beam 64, and a portion farther from the bottom portion 22 is less likely to be heated by the laser beam 64. For example, the side wall 20 and the lid 24 of the crucible 12 are less likely to be heated by the laser beam 64. In the present embodiment, in order to efficiently heat the whole crucible 12, at least one of a thermal reflector 30, a muffle 40, and a cover 50 is provided outside the crucible 12.

The thermal reflector 30 is a cylindrical member provided on an outer periphery of the crucible 12. The thermal reflector 30 is provided to face the side wall 20 of the crucible 12 in the radial direction. The thermal reflector 30 reflects radiant heat from the crucible 12, and suppresses a decrease in the temperature of the crucible 12. The thermal reflector 30 is made of a metal material, and for example, is made of high melting metal such as tungsten (W), molybdenum (Mo), and tantalum (Ta), or an alloy thereof.

The thermal reflector 30 extends in the axial direction from an open end 34 toward a fixed end 36. A length in the axial direction of the thermal reflector 30 is preferably longer than a length in the axial direction of the crucible 12, and it is preferable that the thermal reflector 30 is provided to cover the whole side wall 20 of the crucible 12. The thermal reflector 30 has an opening 32 for causing the laser beam 64 to pass therethrough. A dimension in the radial direction of the opening 32 of the thermal reflector 30 is larger than a dimension in the radial direction of the bottom portion 22 of the crucible 12.

A method of fixing the thermal reflector 30 is not particularly limited, and for example, the thermal reflector 30 can be attached to a support member 28 disposed outside the nozzle 14 in the radial direction. For example, the thermal reflector 30 is fixed by attaching a flange extending outward in the radial direction in the fixed end 36 to the support member 28. A plate having a low thermal conductivity may be inserted between the thermal reflector 30 and the support member 28. The plate having the low thermal conductivity may be made of zirconia ($ZrO_2$).

The muffle 40 is a cylindrical member provided on the outer periphery of the crucible 12. The muffle 40 is provided outside the thermal reflector 30 in the radial direction. Therefore, the thermal reflector 30 is disposed between the crucible 12 and the muffle 40. The muffle 40 is made of a ceramic material such as alumina ($Al_2O_3$), aluminum nitride (AlN), and boron nitride (BN). The muffle 40 is heated by absorbing radiant heat from the crucible 12 or the thermal reflector 30. Since the muffle 40 is provided, the crucible 12 and the thermal reflector 30 are kept warm, and the temperature of the crucible 12 is uniformly distributed.

The muffle 40 extends in the axial direction from the opening end 44 toward a fixed end 46. The length in the axial direction of the muffle 40 is preferably longer than the length in the axial direction of the crucible 12, and is preferably longer than the length in the axial direction of the thermal reflector 30. The muffle 40 is preferably provided to cover the whole thermal reflector 30.

The muffle 40 has an opening 42 for causing the laser beam 64 to pass therethrough. The opening 42 of the muffle 40 communicates with the opening 32 of the thermal reflector 30. The muffle 40 has a cap portion 48 extending inward in the radial direction from the opening end 44 toward the opening 42. The opening 42 is provided near a center of the cap portion 48. The dimension in the radial direction of the opening 42 of the muffle 40 is smaller than the dimension in the radial direction of the opening 32 of the thermal reflector 30. Since the cap portion 48 is provided, an advantageous effect of keeping the crucible 12 and the thermal reflector 30 warm can highly be achieved.

A method of fixing the muffle 40 is not particularly limited. However, for example, as in the thermal reflector 30, the muffle 40 can be fixed by attaching a flange extending outward in the radial direction in the fixed end 46 to the support member 28. In this case, the flange of the thermal reflector 30 is pinched and fixed between the flange of the muffle 40 and the support member 28.

The cover 50 is provided outside the muffle 40, and is provided to cover the whole muffle 40. The cover 50 may cover the support member 28. The cover 50 reflects the radiant heat from the muffle 40, and suppresses a decrease in the temperature of the muffle 40. The cover 50 is made of a metal material, and for example, is made of stainless steel. The cover 50 has an opening 52 for causing the laser beam 64 to pass therethrough. The opening 52 of the cover 50 communicates with the opening 42 of the muffle 40 and the opening 32 of the thermal reflector 30. The dimension in the radial direction of the opening 52 of the cover 50 is not particularly limited. However, the dimension can be set to approximately the same as the dimension in the radial direction of the opening 42 of the muffle 40.

The vaporizer 10 may further include a temperature sensor (not illustrated). The temperature sensor can be provided to measure the temperature of the crucible 12 and, for example, can be configured to measure the temperature of the side wall 20 of the crucible 12. The temperature sensor may be a thermocouple attached to the side wall 20 of the crucible 12. The thermal reflector 30, the muffle 40, and the cover 50 may be provided with a measurement opening (not illustrated) for causing a cable extending from the temperature sensor to pass therethrough. The measurement opening provided in the thermal reflector 30, the muffle 40, and the cover 50 may be opened in the radial direction.

Next, an operation of the vaporizer 10 will be described. First, the solid sample 62 is placed inside the crucible 12, and the lid 24 is attached. The nozzle 14 is connected to the arc chamber 60, and the thermal reflector 30, the muffle 40, and the cover 50 are attached to cover the outer periphery of the crucible 12. After the inside 72 of the vacuum chamber 70 is depressurized, the crucible 12 is heated by irradiating the crucible 12 with the laser beam 64 from the laser source 16. The electric heater 26 may be turned on to heat the nozzle 14 at the same time. When the crucible 12 is heated to a predetermined temperature, the solid sample 62 is vaporized to generate the source gas. The generated source gas is fetched through the nozzle 14, and is supplied to the arc chamber 60.

According to an example of the present embodiment, the temperature of the crucible 12 can be raised to 1,000° C. or higher within 5 minutes by heating the crucible 12 in a cold state, that is, at a room temperature with the laser beam 64. According to a method of heating the crucible with the electric heater known in the related art, it takes approximately one hour to raise the temperature to 1,000° C. or higher. According to the present embodiment, the crucible 12 can be heated to a predetermined temperature in an extremely short time (within 5 minutes). In this manner, a waiting time for generating the source gas can be significantly shortened, and productivity of the ion implantation process can be improved.

According to the present embodiment, the thermal reflector 30, the muffle 40, and the cover 50 are used in combination. In this manner, a time required for raising the temperature of the crucible 12 to a predetermined temperature can be shortened. For example, when the crucible 12 is irradiated with the laser beam 64 having an output of 450 W by using the muffle 40 and the cover 50 only without using the thermal reflector 30, it takes approximately 5 minutes to raise the temperature of the crucible 12 to 1,000° C. On the other hand, when the crucible 12 is irradiated with the laser beam 64 having the output of 450 W by adding the thermal reflector 30, a time required for raising the temperature of the crucible 12 to 1,000° C. is shortened to approximately 3 to 4 minutes.

In the present embodiment, the bottom portion 22 of the crucible 12 is irradiated with the laser beam 64 to heat the crucible 12. Accordingly, the nozzle 14 separated from the bottom portion 22 is less likely to be heated. According to the present embodiment, the electric heater 26 is provided around the nozzle 14. In this manner, the temperature of the nozzle 14 can be helpfully raised. In this manner, when the vaporized gas is fetched through the nozzle 14, the source gas can be prevented from being stuck in the nozzle 14 due to a decrease in the temperature of the gas, and the source gas can stably be supplied.

In the above-described embodiment, a case has been described where the laser beam 64 is introduced from the outside 74 into the inside 72 of the vacuum chamber 70 through the vacuum window 76. In another embodiment, instead of providing the vacuum window 76, the laser beam 64 may be introduced into the inside 72 of the vacuum chamber 70 by using an optical fiber extending from the outside 74 toward the inside 72 of the vacuum chamber 70. In still another embodiment, the laser source 16 may be disposed on the inside 72 of the vacuum chamber 70.

Subsequently, an ion implantation method of using the above-described ion implanter 100 will be described. Here, an ion implantation process included in a semiconductor device manufacturing method in which an irradiation target of the ion beam is a semiconductor wafer will be described.

Figure 3:
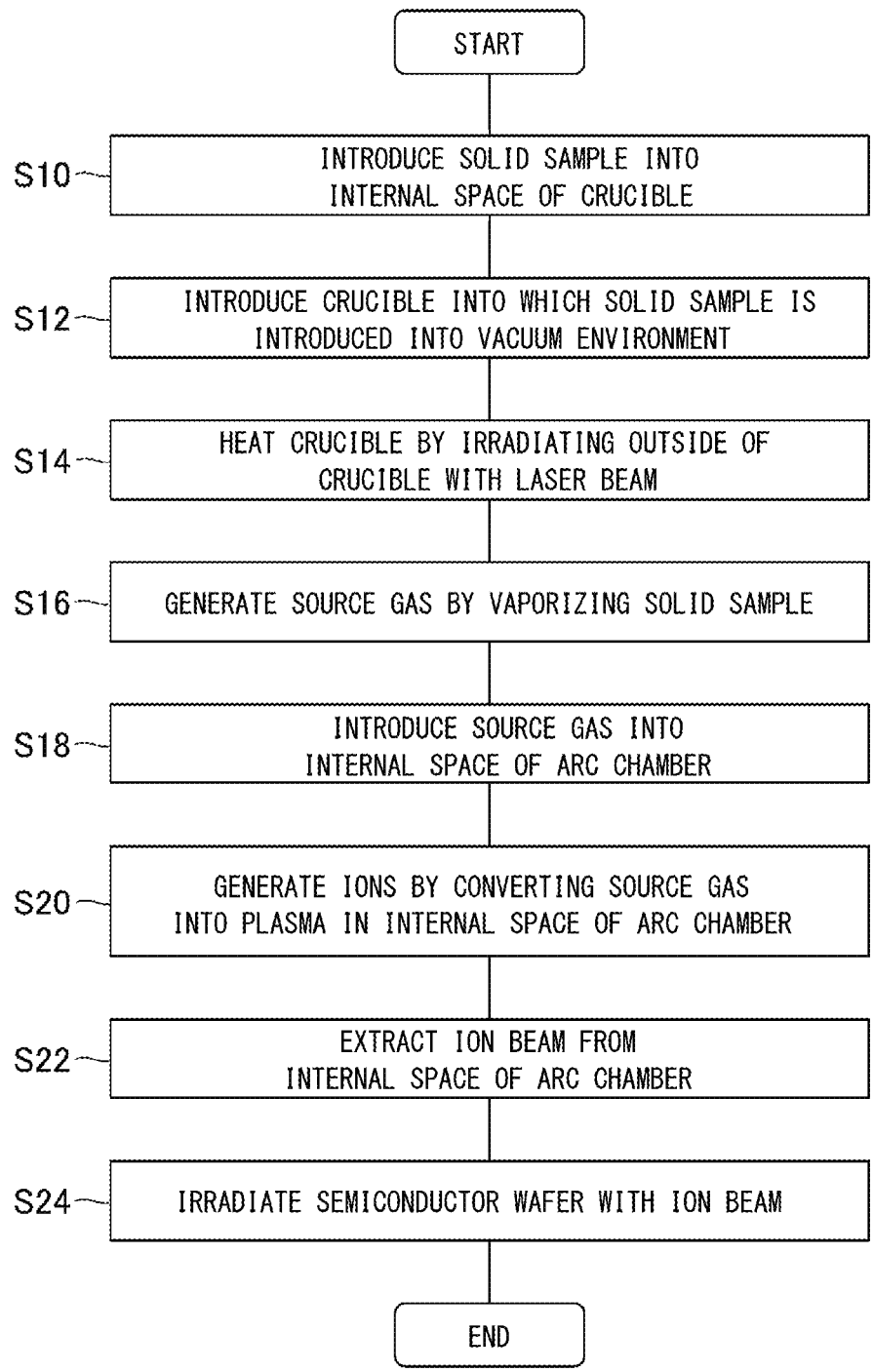
FIG. 3 is a flowchart illustrating an example of an ion implantation method according to an embodiment.

FIG. 3 is a flowchart illustrating an example of an ion implantation method according to an embodiment. First, the solid sample 62 is introduced into the internal space (vaporization chamber 18) of the crucible 12 (S10). For example, in an environment of a normal temperature and a normal pressure, the solid sample 62 is placed in the internal space of the crucible 12, and the lid 24 provided with the nozzle 14 is attached to the crucible 12. Subsequently, the crucible 12 into which the solid sample 62 is introduced into a vacuum environment (S12). For example, the nozzle 14 is connected to the arc chamber 60. In this manner, the crucible 12 is disposed on the inside 72 of the vacuum chamber 70. Thereafter, the inside 72 of the vacuum chamber 70 is depressurized to be brought into a vacuum state. For example, the vacuum environment on the inside 72 of the vacuum chamber 70 is provided by the vacuum exhaust unit 140.

Next, the outside of the crucible 12 is irradiated with the laser beam 64 to heat the crucible 12 (S14). The laser beam 64 is not particularly limited, as long as the laser beam 64 has an output and a wavelength which enable the crucible 12 to be heated to a temperature lower than a melting point of at least a material forming the crucible 12. For example, it is preferable that the wavelength of the laser beam 64 includes ultraviolet, visible, or near-infrared light included in a wavelength range of 200 nm or larger and 2,000 nm or smaller. For example, the output of the laser beam 64 is 0.1 kW or higher and 10 kW or lower, is preferably 0.2 kW or higher and 5 kW or lower, and is more preferably 0.3 kW or higher and 2 kW or lower. Subsequently, the solid sample is vaporized in the internal space of the heated crucible 12 to generate the source gas (S16). The temperature at which the crucible 12 is heated by the laser beam 64 is 100° C. or higher and 3,000° C. or lower, is preferably 500° C. or higher and 2,000° C. or lower, and is more preferably 700° C. or higher and 1,500° C. or lower.

Next, the source gas generated in the internal space of the crucible 12 is introduced into the internal space of the arc chamber 60 (S18). For example, the source gas is supplied into the internal space 68 of the arc chamber 60 through the nozzle 14 that connects the internal space 68 of the crucible 12 and the internal space of the arc chamber 60. In this case, in order to prevent the source gas from being cooled and stuck in the nozzle 14, the nozzle 14 may be heated by the electric heater 26. Subsequently, the source gas is converted into plasma in the internal space 68 of the arc chamber 60 to generate the ions (S20), and the ion beam 66 is extracted from the internal space 68 of the arc chamber 60 (S22). The semiconductor wafer W is irradiated with the extracted ion beam 66 (S24). For example, as the ion beam 66, only a specific ion species is selected by the mass analyzing unit 116, and is subjected to at least one of deflection, acceleration, deceleration, shaping, and scanning in the beamline unit 120. Thereafter, the semiconductor wafer W is irradiated with the ion beam 66 in the implantation processing unit 130.

Hitherto, the present disclosure has been described with reference to each of the above-described embodiments. However, the present disclosure is not limited to each of the above-described embodiments. The configurations of each of the embodiments may appropriately be combined or replaced. In addition, the combination or the process order in each embodiment can appropriately be rearranged, based on the knowledge of those skilled in the art, and modifications such as various design changes can be added to the embodiments. The embodiments to which the modifications are added in this way may also be included in the scope of the ion implanter, the ion implantation method, and the semiconductor device manufacturing method according to the present disclosure.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
   a crucible provided inside a vacuum chamber, and including an internal space configured to accommodate a solid sample which is a raw material of a source gas;
   a laser source provided outside the vacuum chamber, and irradiating the crucible with a laser beam;
   an arc chamber including an internal space for converting the source gas into plasma to generate ions, and in which an ion beam is extracted from the internal space; and
   a nozzle connecting the internal space of the crucible and the internal space of the arc chamber, and introducing the source gas vaporized in the internal space of the crucible into the internal space of the arc chamber.

2. The ion implanter according to claim 1, further comprising:
   a muffle provided on an outer periphery of the crucible, and including an opening through which the laser beam passes.

3. The ion implanter according to claim 2, further comprising:
   a thermal reflector provided between the crucible and the muffle, and including an opening through which the laser beam passes.

4. The ion implanter according to claim 3, further comprising:
   a cover provided outside the muffle, and including an opening through which the laser beam passes.

5. The ion implanter according to claim 1, further comprising:
   an electric heater heating the nozzle.

6. The ion implanter according to claim 1,
   wherein a bottom portion of the crucible located on a side opposite to the nozzle is irradiated with the laser beam.

7. The ion implanter according to claim 1,
   wherein the laser source outputs the laser beam having an output selected from a range of 0.1 kW or higher and 10 kW or lower, and having a wavelength range selected from a range of 200 nm or larger and 2,000 nm or smaller.

8. The ion implanter according to claim 1,
   wherein the crucible is made of graphite.

9. The ion implanter according to claim 1, wherein the laser beam from the laser source is irradiated onto the crucible through a vacuum window provided in the vacuum chamber.

10. The ion implanter according to claim 9, further comprising a cooling path through which a fluid for cooling the vacuum window passes.

11. The ion implanter according to claim 3, further comprising a support member disposed outside the nozzle,
    wherein the thermal reflector has an open end, a fixed end and a flange extending outward in the fixed end,
    wherein the thermal reflector extends from the open end to the fixed end, and
    wherein the thermal reflector is fixed by attaching the flange to the support member.

12. The ion implanter according to claim 11, further comprising a low thermal conductivity plate inserted between the thermal reflector and the support member.

13. The ion implanter according to claim 12, wherein the low thermal conductivity plate comprises zirconia.

14. The ion implanter according to claim 4, further comprising a support member disposed outside the nozzle,
    wherein the muffle has an open end, a fixed end and a flange extending outward in the fixed end,
    wherein the muffle extends from the open end to the fixed end, and
    wherein the muffle is fixed by attaching the flange to the support member.

* * * * *